(12) United States Patent
Yoon et al.

(10) Patent No.: US 12,381,084 B2
(45) Date of Patent: Aug. 5, 2025

(54) APPARATUS AND METHOD FOR TREATING SUBSTRATE

(71) Applicant: SEMES CO., LTD., Cheonan-si (KR)

(72) Inventors: Hyun Yoon, Hwaseong-si (KR); Ki Hoon Choi, Cheonan-si (KR); Tae Hee Kim, Yongin-si (KR); Hyo Won Yang, Seoul (KR); Young Dae Chung, Incheon (KR); Ji Hoon Jeong, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 522 days.

(21) Appl. No.: 17/943,452

(22) Filed: Sep. 13, 2022

(65) Prior Publication Data

US 2023/0084076 A1    Mar. 16, 2023

(30) Foreign Application Priority Data

Sep. 13, 2021   (KR) .......................... 10-2021-0121607

(51) Int. Cl.
*H01L 21/268* (2006.01)
*H01L 21/311* (2006.01)
*H01L 21/67* (2006.01)

(52) U.S. Cl.
CPC ...... *H01L 21/268* (2013.01); *H01L 21/67028* (2013.01); *H01L 21/67115* (2013.01)

(58) Field of Classification Search
CPC ......... H01L 21/67051; H01L 21/67115; H01L 21/6715; H01L 21/6708; H01L 21/268;
(Continued)

(56) References Cited

U.S. PATENT DOCUMENTS

2010/0147327 A1* 6/2010 Kondo .................. B23K 26/12
                                                                134/1
2019/0311923 A1* 10/2019 Kim .................. H01L 21/6708
(Continued)

FOREIGN PATENT DOCUMENTS

JP    2016-024049 A    2/2016
KR    100484498 B1    4/2005
(Continued)

OTHER PUBLICATIONS

Korean Office Action dated Aug. 26, 2024 issued in corresponding Korean Patent Application No. 10-2021-0121607.

*Primary Examiner* — Stewart A Fraser
(74) *Attorney, Agent, or Firm* — Harness, Dickey & Pierce, P.L.C.

(57) ABSTRACT

The inventive concept provides a mask treating apparatus. The mask treating apparatus includes a support unit configured to support and rotate a mask, the mask having a first pattern within a plurality of cells thereof and a second pattern outside regions of the plurality of cells; a heating unit including a laser irradiation module and a moving module, the laser irradiation module having a laser irradiator for irradiating a laser light to the second pattern, the moving module configured to change a position of the laser irradiation module; and a controller configured to control the support unit and the heating unit, and wherein when a treating position is divided into four equal parts from a first quadrant to a fourth quadrant based on a center of the mask, the laser irradiator is positioned at the fourth quadrant and the first quadrant in a direction linearly moving from a standby position to the treating position, positioned at the third quadrant in a direction which is perpendicular to the fourth quadrant, and positioned at the second quadrant in a direction which is perpendicular to the first quadrant, and
(Continued)

wherein the controller controls a rotation of the support unit so the second pattern is positioned at the fourth quadrant.

12 Claims, 17 Drawing Sheets

(58) Field of Classification Search
CPC .......... H01L 21/67028; H01L 21/6831; G03F 7/162; G03F 7/707; G03F 7/16
See application file for complete search history.

(56) References Cited

U.S. PATENT DOCUMENTS

| | | | |
|---|---|---|---|
| 2020/0075362 A1* | 3/2020 | Kwon | .................. H01L 21/6708 |
| 2020/0395210 A1* | 12/2020 | Kwon | .................. B23K 26/362 |
| 2020/0411322 A1* | 12/2020 | Lee | .................. H01L 21/67069 |

FOREIGN PATENT DOCUMENTS

| KR | 102008311 B1 | 8/2019 |
|---|---|---|
| KR | 10-2020-0000147 A | 1/2020 |
| KR | 10-2020-0144164 A | 12/2020 |
| KR | 102229786 B1 | 3/2021 |
| KR | 10-2021-0071135 A | 6/2021 |
| KR | 10-2021-0101287 A | 8/2021 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2021-0121607 filed on Sep. 13, 2021, in the Korean Intellectual Property Office, the entire contents of which are hereby incorporated by reference.

BACKGROUND

Embodiments of the inventive concept described herein relate to a substrate treating apparatus and a substrate treating method.

In order to manufacture a semiconductor element, various processes such as a photolithography process, an etching process, an ashing process, an ion implantation process, and a thin film deposition process are performed on a substrate such as a wafer. Various treating liquids and treatment gases are used in each process. In addition, a drying process is performed on the substrate to remove a treating liquid used to treat the substrate from the substrate.

The photolithography process for forming a pattern on the wafer includes an exposing process. The exposing process is an operation which is previously performed for cutting a semiconductor integrated material attached to the wafer into a desired pattern. The exposing process may have various purposes such as forming a pattern for an etching and forming a pattern for the ion implantation. In the exposing process, the pattern is drawn in on the wafer with a light using a mask, which is a kind of frame. When the light is exposed to the semiconductor integrated material on the wafer, for example, a resist on the wafer, chemical properties of the resist change according to a pattern by the light and the mask. When a developing liquid is supplied to a resist which chemical properties have changed according to the pattern, the pattern is formed on the wafer.

In order to precisely perform the exposing process, the pattern formed on the mask must be precisely manufactured. To confirm that the pattern is formed in a desired form and precisely, an operator inspects a formed pattern using an inspection equipment such as a scanning electron microscope (SEM). However, a large number of patterns are formed on one mask. That is, it takes a lot of time to inspect all of the large number of patterns to inspect one mask.

Accordingly, a monitoring pattern capable of representing one pattern group including a plurality of patterns is formed on the mask. In addition, an anchor pattern that may represent a plurality of pattern groups are formed on the mask. The operator may estimate whether patterns formed on the mask are good or not through an inspecting of the anchor pattern. In addition, the operator may estimate whether patterns included in one pattern group are good or not through an inspecting of the monitoring pattern.

As described above, the operator may effectively shorten a time required for a mask inspection due to the monitoring pattern and the anchor pattern formed on the mask. However, in order to increase an accuracy of the mask inspection, it is preferable that critical dimension of the monitoring pattern and the anchor pattern are the same.

When an etching is performed to equalize the critical dimension of the monitoring pattern and the critical dimension of the anchor pattern, an over-etching may occur at the pattern. For example, a difference between an etching rate for the critical dimension of the monitoring pattern and an etching rate for the anchor pattern may occur several times, and in the process of repeatedly etching the monitoring pattern and/or the anchor pattern to reduce the difference, the over-etching may occur at the critical dimension of the monitoring pattern and the critical dimension of the anchor pattern. When the etching process is precisely performed to minimize an occurrence of such over-etching, the etching process takes a lot of time. Accordingly, a critical dimension correction process for precisely correcting the critical dimension of patterns formed on the mask is additionally performed.

FIG. 1 illustrates a normal distribution regarding a first critical dimension CDP1 of the monitoring pattern of the mask and a second critical dimension CDP2 (a critical dimension of the anchor pattern) before a critical dimension correction process, which is a last step, is performed during a mask manufacturing process. In addition, the first critical dimension CDP1 and the second critical dimension CDP2 have a size smaller than a target critical dimension. Also, as can be referred from FIG. 2, before the critical dimension correction process is performed, there is a deliberate deviation between the critical dimension of the monitoring pattern and the anchor pattern (CD, critical dimension). And, by additionally etching the anchor pattern in the critical dimension correction process, the critical dimension of these two patterns are made the same.

In the critical dimension correction process, an etching chemical is supplied onto the substrate so that the first critical dimension CDP1 and the second critical dimension CDP2 have the target critical dimension. However, when the etching chemical is uniformly supplied onto the substrate, even if one of the first critical dimension CDP1 or the second critical dimension CDP2 can reach the target critical dimension, it is difficult for the other of the first critical dimension CDP1 or the second critical dimension CDP2 to reach the target critical dimension. Furthermore, a deviation between the first critical dimension CDP1 and the second critical dimension CDP2 is not reduced.

SUMMARY

Embodiments of the inventive concept provide a substrate treating apparatus and a substrate treating method for efficiently treating a substrate.

Embodiments of the inventive concept provide a substrate treating apparatus and a substrate treating method for making a critical dimension of a pattern formed on a substrate uniform.

Embodiments of the inventive concept provide a substrate treating apparatus and a substrate treating method for correcting an irradiation direction of a laser irradiated onto a substrate.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a support unit configured to support a substrate having a first pattern and a second pattern which is formed at a different position from the first pattern; a liquid supply unit for supplying a treating liquid to the substrate supported on the support unit; a heating unit configured to irradiate a laser to the substrate to which the treating liquid is supplied and to heat any one among the first pattern or the second pattern; and an error checking unit configured to check an error between an irradiation position of the laser and a target position which is preset.

In an embodiment, the error checking unit includes: a coordinate system which is provided at the same height as the substrate supported on the support unit; and a support frame for supporting the coordinate system.

In an embodiment, the heating unit includes: a laser irradiation unit configured to irradiate the laser; and a tilting member configured to tilt an irradiation direction of a laser irradiated by the laser irradiation unit.

In an embodiment, the heating unit further includes: a body which is installed at the laser irradiation unit and the tilting member, the body including an irradiation end portion for irradiating the laser; and a driver for rotating the body and/or moving the body in an up/down direction.

In an embodiment, the heating unit further includes an image module configured to monitor the laser irradiated by the laser irradiation unit.

In an embodiment, the substrate treating apparatus further includes a controller for controlling the heating unit, and wherein the controller controls the laser irradiation unit to irradiate the laser from the irradiation end portion at a first height, which is a height of the irradiation end portion when irradiating the laser to the substrate, to the coordination system, and checks whether an error occurs between the irradiation position of the laser and the target position through the image module.

In an embodiment, the controller measures a second height which is a height of the irradiation end portion if the irradiation position is at a position closest to the target position, while moving the body in the up/down direction.

In an embodiment, the controller derives a tilting angle of the laser irradiated by the laser irradiation unit through a difference between the first height and the second height, and a gap between an irradiation position and a target position at the first height.

In an embodiment, the controller controls the tilting member to tilt in the irradiation direction of the laser irradiated by the laser irradiation unit based on the tilting angle.

The inventive concept provides a substrate treating apparatus. The substrate treating apparatus includes a housing having an inner space; a treating container provided at the inner space and proving a treating space for treating a substrate, the substrate being a mask having a first pattern and a second pattern which is formed at a different position from the first pattern; a support unit configured to support the substrate at the treating space; a liquid supply unit configured to supply a treating liquid to a substrate supported by the support unit; a heating unit configured to heat any one of the first pattern or the second pattern by irradiating a laser to the substrate supplied with the treating liquid; and an error checking unit configured to check a gap between an irradiation position of the laser and a target position which is preset, and wherein the error checking unit includes: a coordinate system having a top surface provided at the same height as a height of a top surface of the substrate supported by the support unit; and a support frame supporting the coordinate system.

In an embodiment, the heating unit includes: a laser irradiation module configured to irradiate the laser; an image module configured to monitor a laser irradiated by the laser irradiation module and/or the substrate; and an optical module, and wherein the laser irradiation module includes: a laser irradiation unit; and a beam expander for controlling a characteristic of a laser irradiated by the laser irradiation unit, and wherein the image module includes: an image acquisition member configured to acquire an image; and an illumination member configured to provide a light so the image acquiring member may acquire the image, and wherein the optical module includes: a first reflective member configured to change an irradiation direction of the laser irradiated by the laser irradiation unit; and a second reflective member configured to change an imaging direction of the image acquisition member and an irradiation direction of the light, and wherein the irradiation direction of the laser, the imaging direction of the image acquisition member, and the irradiation direction the light have the same axle when seen from above.

In an embodiment, the heating unit includes: a tilting member configured to tilt the irradiation direction of the laser irradiated by the laser irradiation unit; a body at which the laser irradiation unit and the tilting member is installed, the body including an irradiation end portion configured to irradiate the laser; and a driver for rotating the body and/or moving the body in an up/down direction, and wherein the substrate treating apparatus further includes a controller for controlling the heating unit, and the controller controls the laser irradiation unit so the irradiation end portion irradiates the laser to the coordinate system at a first height which is a height of the irradiation end portion if the laser is irradiated to the substrate, checks whether an error has occurred between the irradiation position of the laser and the target position through the image module, measures a second height which is a height of the irradiation end portion if the irradiation position is closest to the target position, while moving the body in the up/down direction, if the error occurs, and derives a tilting angle of the laser irradiated by the laser irradiation unit through a difference between the first height and the second height, and a difference between the irradiation position and the target position at the first height.

The inventive concept provides a substrate treating method. The substrate treating method includes process preparing which is a process preparing step; and treating a substrate after the process preparing step by irradiating a laser to the substrate by a laser irradiation unit which is a process treating step, and wherein the process preparing step includes an error checking step, which is a step of checking an error between an irradiation position of the laser and a target position which is preset, by irradiating the laser from the laser irradiation unit to a coordinate system provided at the same as the substrate, from a first height which is a height at which the laser irradiation unit irradiates the laser at the process treating step.

In an embodiment, the process preparing step further includes an error measuring step of measuring a gap between the irradiation position and the target position, if the error is confirmed.

In an embodiment, the process preparing step further includes a height changing step of moving the laser irradiation unit in an up/down direction to measure a second height which is a height of the laser irradiation unit if the irradiation position is closest to the target position.

In an embodiment, the process preparing step further includes an angle calculating step of deriving a difference between the first height and the second height, and deriving a tilting angle of the laser irradiated from the laser irradiating unit through the gap between the irradiation position and the target position.

In an embodiment, the process preparing step further includes an angle correcting step of tilting the irradiation direction of the laser irradiated from the laser irradiation unit, based on the tilting angle derived at the angle calculating step.

In an embodiment, the tilting of the irradiation direction at the angle correcting step is done by tilting the laser irradiation unit.

In an embodiment, the tilting of the irradiation direction of the angel correcting step is done by tilting a reflective member configured to reflect a laser irradiated by the laser irradiation unit.

In an embodiment, the process treating step includes: a liquid treating step for supplying a treating liquid to the substrate, the substrate being a mask having a first pattern and a second pattern which is formed at a different position from the first pattern; and a heating step for irradiating the laser to the substrate supplied with the treating liquid.

According to an embodiment of the inventive concept, a substrate may be efficiently treated.

According to an embodiment of the inventive concept, a critical dimension of a pattern formed on a substrate may be made uniform.

According to an embodiment of the inventive concept, an irradiation direction of a laser irradiated onto a substrate may be corrected.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
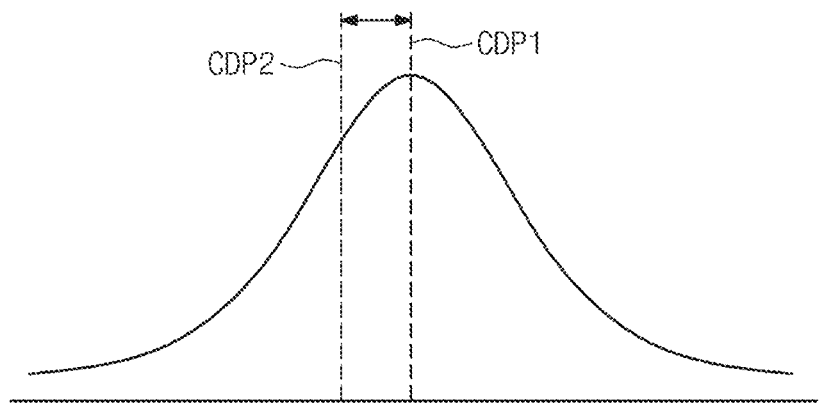
FIG. 1 illustrates a normal distribution of a critical dimension of a monitoring pattern and a critical dimension of an anchor pattern.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to"

another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described in detail with reference to FIG. 2 to FIG. 21.

Figure 2:
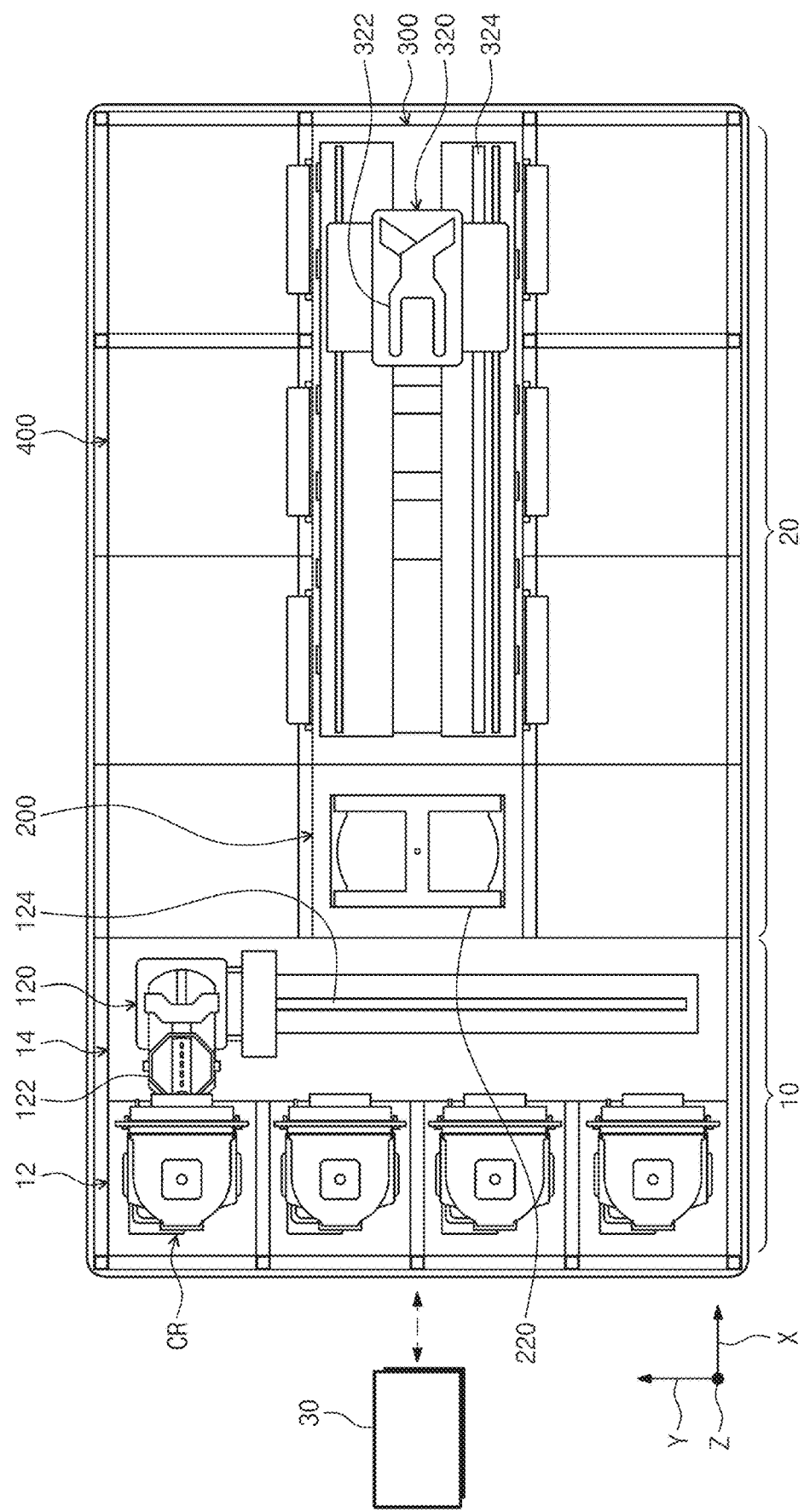
FIG. 2 is a plan view schematically illustrating a substrate treating apparatus according to an embodiment of the inventive concept.

FIG. 2 is a plan view schematically illustrating a substrate treating apparatus according to an embodiment of the inventive concept.

Referring to FIG. 2, the substrate treating apparatus includes an index module 10, a treating module 20, and a controller 30. According to an embodiment, when viewed from above, the index module 10 and the treating module 20 may be disposed along a direction. Hereinafter, a direction in which the index module 10 and the treating module 20 are disposed is referred to as a first direction X, a direction perpendicular to the first direction X when viewed from above is referred to as a second direction Y, and a direction in a perpendicular direction to both the first direction X and the second direction Y is referred to as a third direction Z.

The index module 10 transfers a substrate M from a container C in which the substrate M is accommodated to the treating module 20, and stores a substrate M on which a treatment has been completed at the treating module 20 in the container C. A lengthwise direction of the index module 10 may be provided in the second direction Y. The index module 10 may have a load port 12 and an index frame 14. The load port 12 may be positioned on an opposite side of the treating module 20 with respect to the index frame 14. The container storing the substrates M is placed on the container CR. A plurality of load ports 12 may be provided, and the plurality of load ports 12 may be arranged along the second direction Y.

As the container C, a sealing container such as a front opening unified pod (FOUP) may be used. The container C may be placed on the load port 12 by a transfer means (not shown) such as an overhead transfer, an overhead conveyor, or an automatic guided vehicle, or by an operator.

An index robot 120 may be provided at the index frame 14. In the index frame 14, a guide rail 124 having its lengthwise direction in the second direction Y may be provided, and the index robot 120 may be movable along the guide rail 125. The index robot 120 includes a hand 122 on which the substrate M is placed, and the index hand 122 may be provided to be forwardly and backwardly movable, rotatable in the third direction Z, and movable along the third direction Z. A plurality of hands 122 may be provided to be spaced apart from each other in an up/down direction. The plurality of hands 122 may be forwardly and backwardly movable independently of each other.

The controller 30 may control a substrate treating apparatus. The controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The treating module 20 may include a buffer unit 200, a transfer chamber 300, and a liquid treating chamber 400. The buffer unit 200 provides a space in which a substrate M taken into the treating module 20 and a substrate M taken out of the treating module 20 temporarily remain. The liquid treating chamber 400 performs a liquid treatment process of liquid treating the substrate M by supplying a liquid onto the substrate M. The transfer chamber 300 transfers the substrate M between the buffer unit 200, the liquid treating chamber 400, and the drying chamber 500.

The transfer chamber 300 may have a lengthwise direction provided in the first direction X. The buffer unit 200 may be positioned between the index module 10 and the transfer chamber 300. The liquid treating chamber 400 and the drying chamber 500 may be disposed at a side of the transfer chamber 300. The liquid treating chamber 400 and the transfer chamber 300 may be disposed along the second direction Y. The drying chamber 500 and the transfer chamber 300 may be positioned along the second direction Y. The buffer unit 200 may be positioned at an end of the transfer chamber 200.

According to an embodiment, liquid treating chambers 400 may be disposed on both sides of the transfer chamber 300. The liquid treating chambers 400 may be provided in an arrangement of A×B (where A and B are natural numbers greater than 1 or 1 respectively) along the first direction X and the third direction Z respectively at aside of the transfer chamber 300. The transfer chamber 300 includes a transfer robot 320. In the transfer chamber 300, a guide rail 324 having its lengthwise direction in the first direction X may be provided, and the transfer robot 320 may be movable along the guide rail 342. The transfer robot 320 includes a hand 322 on which the substrate M is place, and the hand 322 may be provided to be forwardly and backwardly movable, to be rotatable around the third direction Z, and movable along the third direction Z. A plurality of hands 322 are provided to be spaced apart from each other in the up/down direction, and the plurality of hands 322 may be forwardly and backwardly movable independently of each other.

The buffer unit 200 has a plurality of buffers on which the substrate M is placed. The buffers may be positioned to be placed apart from each other in the third direction Z. A front face and a rear face of the buffer unit 200 are opened. The front face is a surface facing the index module 10, and the rear face is a surface facing the transfer chamber 300. The index robot 120 may approach the buffer unit 200 through the front face, and the transfer robot 320 to be described later may approach the buffer unit 200 through the rear face.

Hereinafter, a substrate M treated in the liquid treating chamber 400 will be described in detail.

Figure 3:
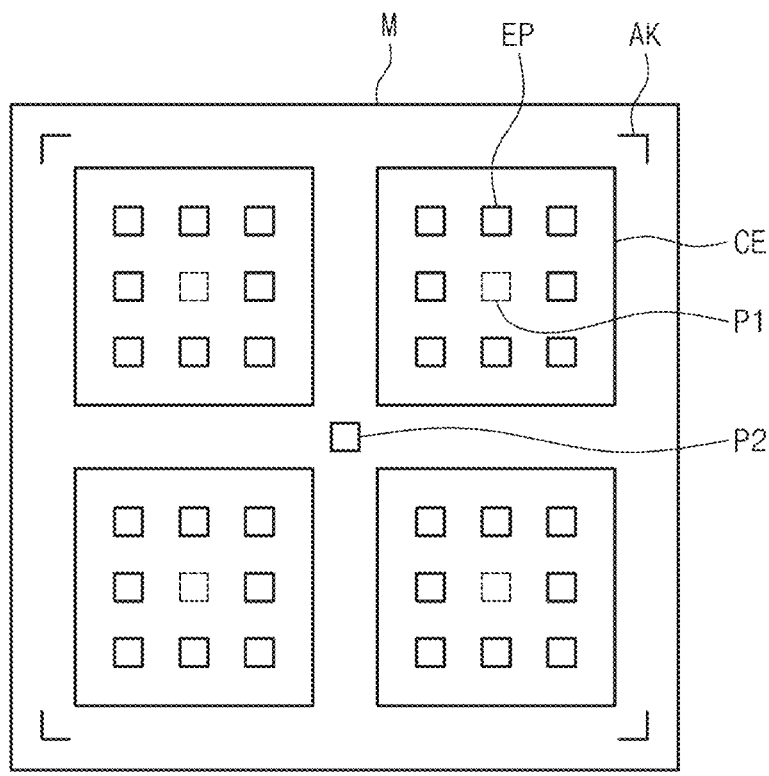
FIG. 3 schematically illustrates a state of a substrate treated at a liquid treating chamber of FIG. 2.

FIG. 3 schematically illustrates a state of the substrate treated in the liquid treating chamber of FIG. 2.

Referring to FIG. 3, an object to be treated in the liquid treating chamber 400 may be any one of a wafer, a glass, and a photomask. For example, the substrate M treated in the liquid treating chamber 400 may be a photo mask, which is a 'frame' used in an exposing process.

The substrate M may have a rectangular form. The substrate M may be a photo mask that is a 'frame' used in the exposing process. At least one reference mark AK may be marked on the substrate M. For example, a plurality of reference marks AK may be formed in each corner region of the substrate M. The reference mark AK may be a mark called an align key used when aligning the substrate M. Also, the reference mark AK may be a mark used to derive a position of the substrate M. For example, an image module 470 to be described later may acquire an image by imaging the reference mark AK and transmit the acquired image to the controller 30. The controller 30 then may analyze the image including the reference mark AK to detect an accurate position of the substrate M. In addition, the reference mark AK may be used to determine a position of the substrate M when the substrate M is transferred.

A cell CE may be formed on the substrate M. At least one cell CE, for example, a plurality of cells CE may be formed. A plurality of patterns may be formed at each cell CE. The patterns formed at each cell CE may be defined as one pattern group. Patterns formed at the cell CE may include an exposing pattern EP and a first pattern P1. A second pattern P2 may be proved in a region outside the cell region where the plurality of cells care formed.

The exposing pattern EP may be used to form an actual pattern on the substrate M. The first pattern P1 may be a single-cell representative pattern representing exposing patterns EP in one cell CE. In addition, when the plurality of cells CE are provided, the first pattern is provided in each cell, thereby a plurality of first patterns P1 may be provided. Also, the plurality of first patterns P1 may be formed in one cell CE. The first pattern P1 may have a form in which portions of each exposing pattern EP are combined. The first pattern P1 may be referred to as a monitoring pattern. Also, the first pattern P1 may be referred to as a critical dimension monitoring macro.

When an operator inspects the first pattern P1 through a scanning electron microscope (SEM), it is possible to estimate whether a form of the exposing patterns EPs formed in one cell CE are good or bad. Also, the first pattern P1 may serve as an inspection pattern to inspect the exposing patters EPs. Also, the first pattern P1 may be any one of the exposing patterns EPs used in an actual exposing process. In addition, the first pattern P1 may be serve as not only inspection pattern to inspect the exposing patterns but also exposing pattern used in the actual exposing.

The second pattern P2 may be an entire-cell representative pattern representing exposing patterns EP on whole cells of the substrate M. For example, the second pattern P2 may have a form in which portions of each of the first patterns P1 are combined.

When the operator inspects the second pattern P2 through the scanning electron microscope (SEM), it is possible to estimate whether a form of the exposing patterns EPs formed on one substrate M are good or bad. Also, the second pattern P2 may serve an inspection pattern. In addition, the second pattern P2 may be an inspection pattern that is not used in an actual exposing process. The second pattern P2 may be referred to as an anchor pattern.

Hereinafter, the substrate treating apparatus provided to the liquid treating chamber 400 will be described in detail. Hereinafter, a treating process performed while the liquid treating chamber 400 performs a fine critical dimension correction (FCC) process, which is a last step during a process of manufacturing a mask for an exposing process will be described as an example.

A substrate M to be taken in and treated at the liquid treating chamber 400 may be a substrate M on which a pre-treatment has been performed. A critical dimension of the first pattern P1 and a critical dimension of the second pattern P2 of the substrate M to be taken into the liquid treating chamber 400 may be different from each other. For example, the critical dimension of the first pattern P1 may be greater than the critical dimension of the second pattern P2. In on embodiment, the critical dimension of the first pattern P1 may have a first width (e.g., 69 nm). The critical dimension of the second pattern P2 may have a second width (e.g., 68.5 nm).

Figure 4:
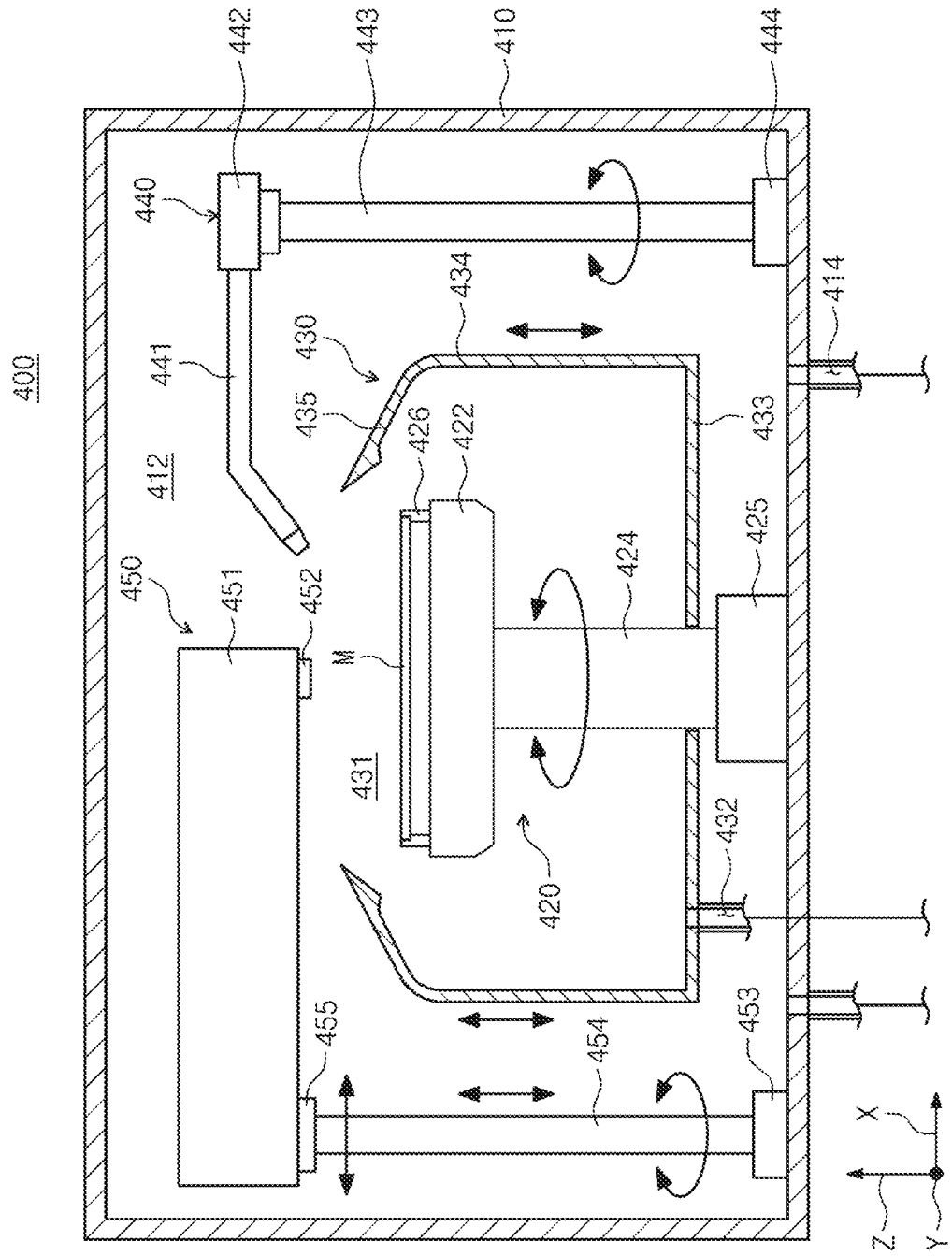
FIG. 4 schematically illustrates an embodiment of the liquid treating chamber of FIG. 2.
Figure 5:
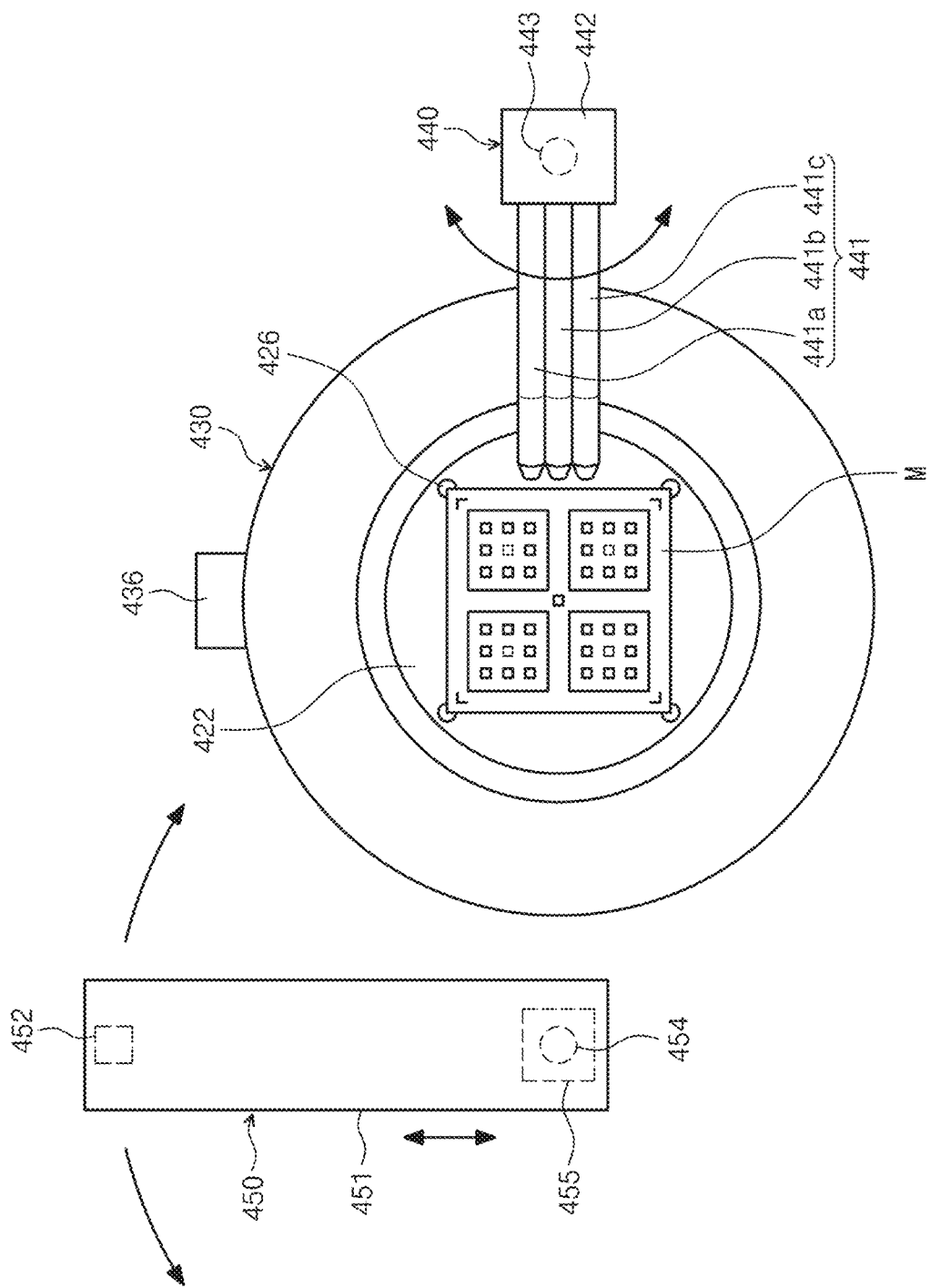
FIG. 5 is a top view of the liquid treating chamber of FIG. 4.

FIG. 4 schematically illustrates an embodiment of the liquid treating chamber of FIG. 2, and FIG. 5 is a top view of the liquid treating chamber of FIG. 4. Referring to FIG. 4 and FIG. 5, the liquid treating chamber 400 may include a housing (not shown), a support unit 420, a bowl 430, a liquid supply unit 440, a heating unit 450, and an error checking unit 490.

The housing (not shown) may have an inner space 412. The housing (not shown) may have the inner space 412 providing a bowl 430. The housing (not shown) may have an inner space 412 in which the liquid supply unit 440 and the heating unit 450 are provided. The housing (not shown) may be provided with a gateway (not shown) through which the substrate M may be taken in and taken out. The gateway may be selectively opened/closed by a door (not shown). An inner wall surface of the housing (not shown) may be coated with a material having a high corrosion resistance to a chemical supplied by the liquid supply unit 440.

Also, an exhaust hole 414 may be formed on a bottom surface of the housing 410.

The exhaust hole 414 may be connected to an exhaust member such as a pump capable of exhausting the inner space 412. Accordingly, a fume or the like that may be generated at the inner space 412 may be exhausted to an outside through the exhaust hole 414.

The support unit 420 may support the substrate M in a treating space 431 of the bowl 430 to be described later. The support unit 420 may support the substrate M. The support unit 420 may rotate the substrate M.

The support unit 420 may include a chuck 422, a support shaft 424, a driving member 425, and a support pin 426. The support pin 426 may be installed on the chuck 422. The chuck 422 may have a plate shape having a preset thickness. The support shaft 424 may be coupled to a bottom of the chuck 422. The support shaft 424 may be a hollow shaft. Also, the support shaft 424 may be rotated by the driving member 425. The driving member 425 may be a hollow motor. When the driving member 425 rotates the support shaft 424, the chuck 422 coupled to the support shaft 424 may rotate. The substrate M placed on the support pin 426 installed on the chuck 422 may also be rotated together by the rotation of the chuck 422.

The support pin 426 may support the substrate M. A plurality of support pins 426 are provide along a circumferential direction of the top side chuck 421, thereby viewed from above, the support pins 426 may have a substantially circular form. Also, when viewed from above, the support pin 426 may have a downwardly recessed/stepped portion corresponding to an edge region of the substrate M. Therefore, the support pin 426 may include first surface supporting a bottom of the edge region of the substrate M and a second surface facing a side of the edge region of the substrate M to limit a lateral movement of the substrate if the substrate is rotated. At least one support pin 426 may be provided. In an embodiment, a plurality of support pins 426 may be provided. The support pins 422 may be provided in a number corresponding to the number of corners of the substrate M having a rectangular form. The support pin 422 may support the back-side (bottom surface) of the substrate M to be spaced apart from a top surface of the chuck 421.

The bowl 430 may have a cylindrical form with an open top. The bowl 430 may have a treating space 431, and the substrate M may be liquid-treated and heat-treated in the treating space 431. The bowl 430 can prevent the treating liquid supplied to the substrate M from being scattered and transmitted to the housing 410, the liquid supply unit 440, and the heating unit 450.

The bowl 430 may include a bottom portion 433, a vertical portion 434, and an inclined portion 435. When viewed from above, the bottom portion 433 may have an opening into which the support shaft 424 may be inserted. The vertical portion 434 may extend from the bottom portion 433 in the third direction Z. The inclined portion 435 may extend to be upwardly inclined from the vertical portion 434. For example, the inclined portion 435 may extend inclined in a direction toward the substrate M supported by the support unit 420. A discharge hole 432 capable of discharging a treating liquid supplied by the liquid supply unit 440 to the outside may be formed at the bottom portion 433. In addition, the bowl 430 may be coupled to the lifting/lowering member 436, and its position may be changed along the third direction Z. The lifting/lowering member 436 may be a driving device for moving the bowl 430 in the up/down direction. The lifting/lowering member 436 may move the bowl 430 upwardly while the liquid treatment and/or heating treatment is performed on the substrate M, and may move the bowl 430 downwardly when the substrate M is taken into the inner space 412, or when the substrate M is taken out from the inner space 412.

The liquid supply unit 440 may supply a treating liquid for a liquid treating the substrate M. The liquid supply unit 440 may supply the treated liquid to the substrate M supported by the support unit 420. The treating liquid may be an etching liquid or a rinsing liquid. The etching liquid may be chemical. The etching liquid may etch a pattern formed on the substrate M. The etchant may be referred to as an etchant. The rinsing liquid may clean the substrate M. The rinsing liquid may be provided as a known chemical liquid.

The liquid supply unit 440 may include a nozzle 441, a fixing body 442, a rotation shaft 443, and a rotation member 444.

The nozzle 441 may supply the treating liquid to the substrate M supported by the support unit 420. An end of the nozzle 441 may be connected to the fixing body 442, and another end thereof may extend in a direction from the fixing body 442 toward the substrate M. The nozzle 411 may extend from the fixing body 442 in the first direction X.

The nozzle 411 may include a first nozzle 411*a*, a second nozzle 411*b*, and a third nozzle 411*c*. Any one of the first nozzle 411*a*, the second nozzle 411*b*, or the third nozzle 411*c* may supply a chemical C among the above-described treating liquids. In addition, another one of the first nozzle 411*a*, the second nozzle 411*b*, and the third nozzle 411*c* may supply the rinsing liquid R among the aforementioned treating liquids. Also, the last one of the first nozzle 411*a*, the second nozzle 411*b*, or the third nozzle 411*c* may supply a different kind of chemical C which is different from a chemical C supplied by the another one of the first nozzle 411*a*, the second nozzle 411*b*, or the third nozzle 411*c*.

A body 442 may fix and support the nozzle 441. The body 442 may be connected to the rotation shaft 443 rotated in the third direction Z by the rotation member 444. When the rotation member 444 rotates the rotation shaft 443, the body 442 may rotate around the third direction Z. Accordingly, an outlet of the nozzle 441 may move between a liquid supply position which is a position where the treating liquid is supplied to the substrate M and a standby position which is a position where the treating liquid is not supplied to the substrate M.

The heating unit 450 may heat the substrate M. The heating unit 450 may heat a partial region of the substrate M. The heating unit 450 may heat the substrate M on which a liquid film is formed by supplying the chemical C. The heating unit 450 may heat a pattern formed on the substrate M. The heating unit 450 may heat some of the patterns formed on the substrate M. The heating unit 450 may heat any one of the first pattern P1 or the second pattern P2. For example, the heating unit 450 may heat the second pattern P2 among the first pattern P1 and the second pattern P2.

The heating unit 450 may include a body 451, a driver 453, a shaft 454, a moving member 455, a laser module 460, an image module 470, and an optical module 480.

The body 451 may be a container having an installation space therein. The body 451 may be provided with a laser irradiation module 460 to be described later, an image module 470 and an optical module 480. Also, the body 451 may include an irradiation end portion 452. The laser L emitted by the laser module 460 to be described later may be emitted to the substrate M through the irradiation end portion 452. In addition, a light irradiated by the illumination member 472 to be described later may be provided through the irradiation end portion 452. In addition, an image imaging of an image acquisition member 471 to be described later may be performed through the irradiation end portion 452.

The driver 453 may be a motor. The driver 453 may be connected to the shaft 454. Also, the shaft 454 may be connected to the body 451. The shaft 454 may be connected to the body 451 via the moving member 455. The driver 453 may rotate the shaft 454. When the shaft 454 is rotated, the body 451 may be rotated. Accordingly, a position of the irradiation end portion 452 of the body 451 may also be changed. For example, the position of the irradiation end portion 452 may be changed using the third direction Z as a rotation axis. When viewed from above, a center of the irradiation end portion 452 may be moved in an arc around the shaft 454. When viewed from above, the center of the irradiation end portion 452 may be moved to pass through a center of the substrate M supported by the support unit 420. The irradiation end portion 452 may be moved between a heating position to irradiate the laser L to the substrate M and a standby position which is a standby position when a heating is not performed on the substrate M. Also, the driver 453 may move the shaft 454 in the up/down direction. That is, the driver 453 may change the position of the irradiation end portion 452 in the up/down direction. In addition, a plurality of drivers 453 may be provided, one of which may be provided as a rotating motor for rotating the shaft 454, and the other may be provided as a linear motor for moving the shaft 454 in the up/down direction.

The moving member 455 may be provided between the shaft 454 and the body 451. The moving member 455 may be an LM guide. The moving member 455 may move the body 451 in a lateral direction. The moving member 455 may move the body 451 along the first direction X and/or the second direction Y. The position of the irradiation end portion 452 of the heating unit 450 may be variously modified by the moving member 455 and the driver 453.

Figure 6:
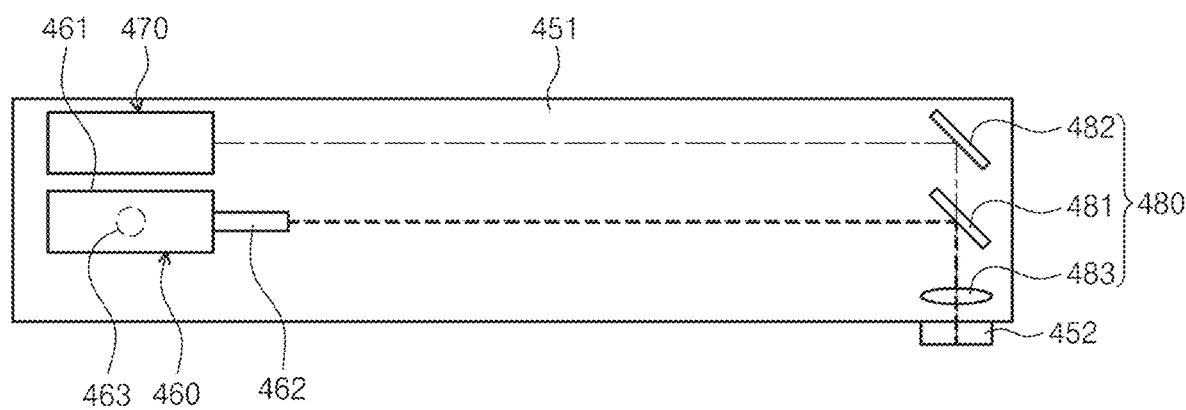
FIG. 6 illustrates a body, a laser module, an image module, and an optical module of a heating unit of FIG. 4.
Figure 7:
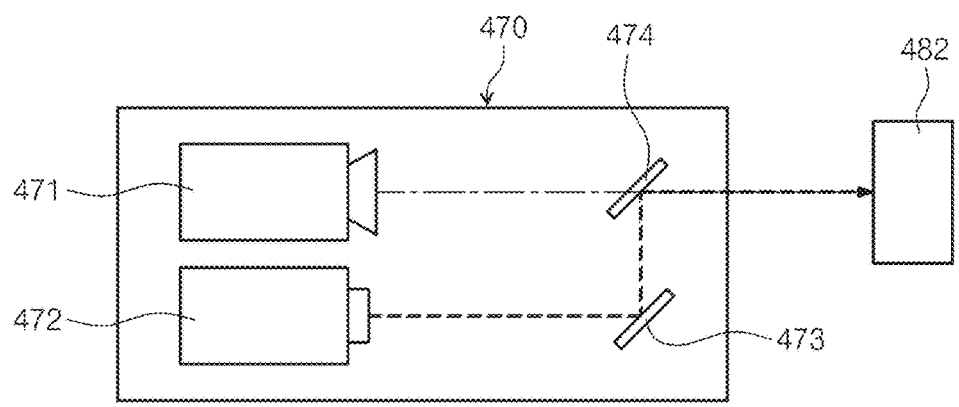
FIG. 7 is a top view of an image module of FIG. 6.

FIG. 6 illustrates a body, a laser module, an image module, and an optical module of the heating unit of FIG. 4, and FIG. 7 is a top view of the image module of FIG. 6.

Referring to FIG. 6 and FIG. 7, a laser irradiation unit 461, a beam expander 462, and a tilting member 463 may be installed at the body 451. Also, an image module 470 may be installed at the body 451. Also, an optical module 480 may be installed at the body 451.

The laser module 460 may include a laser irradiation unit 461, a beam expander 462, and a tilting member 463. The laser irradiation unit 461 may irradiate the laser L. The laser irradiation unit 461 may emit the laser L having a straightness. A form/profile of the laser L emitted by the laser irradiation unit 461 may be adjusted by the beam expander 462. For example, a diameter of the laser L emitted by the laser irradiation unit 461 may be changed by the beam expander 462. The diameter of the laser L emitted by the laser irradiation unit 461 may be expanded or reduced by the beam expander 462.

The tilting member 463 may tilt an irradiation direction of the laser L emitted by the laser irradiation unit 461. For example, the tilting member 463 may rotate the laser irradiation unit 461 based on an axis to tilt the irradiation direction of the laser L irradiated by the laser irradiation unit 461. The tilting member 463 may include a motor.

The image module 470 may monitor the laser L emitted by the laser irradiation unit 461. The image module 470 may include an image acquisition member 471, an illumination member 472, a first reflective plate 473, and a second reflective plate 474. The image acquisition member 471 may acquire an image of the substrate M and/or a coordinate system 491 of the error checking unit 490 to be described later. The image acquisition member 471 may be a camera. The image acquisition member 471 may acquire an image including a point at which the laser L irradiated by the laser irradiation unit 461 is irradiated.

The illumination member 472 may provide a light so that an image acquisition of the image acquisition member 471 may be easily performed. A light provided by the illumination member 472 may be sequentially reflected along the first reflective plate 473 and the second reflective plate 474.

The optical module 480 may have a coaxial of an irradiation direction of the laser L irradiated by the laser irradiation unit 461, an imaging direction in which the image acquisition member 471 acquires an image, and an irradiation direction of a light provided by the illumination member 472 when viewed from above. The illumination member 472 may transmit a light to a region to which the laser L is irradiated by the optical module 480. In addition, the image acquisition member 471 may acquire an image such as an image/photo for a region to which the laser L is irradiated in real time. The optical module 480 may include a first reflective member 481, a second reflective member 482, and a lens 483.

The first reflective member 481 may change an irradiation direction of the laser L emitted by the laser irradiation unit 461. For example, the first reflective member 481 may change the irradiation direction of the laser L irradiated in a horizontal direction to a vertical downward direction. In addition, a laser L refracted by the first reflective member 481 may sequentially pass through the lens 483 and the irradiation end portion 452, and may be transmitted to a substrate M to be treated or to the coordinate system 491 to be described later.

The second reflective member 482 may change the imaging direction of the image acquisition member 471. For example, the second reflective member 482 may change the imaging direction of the image acquisition member 471 in the horizontal direction to the vertical downward direction. In addition, the second reflective member 482 may change the irradiation direction of light of the illumination member 472 sequentially transmitted through the first reflective plate 473 and the second reflective plate 474 from the horizontal direction to the vertical downward direction.

In addition, the first reflective member 481 and the second reflective member 482 may be provided at the same position when viewed from above. The first reflective member 481 and the second reflective member 422 are may be disposed such that the imaging direction and the laser pathway coincide. In addition, the second reflective member 482 may be disposed above the first reflective member 481. In addition, the first reflective member 481 and the second reflective member 482 may be tilted at the same angle.

Figure 8:
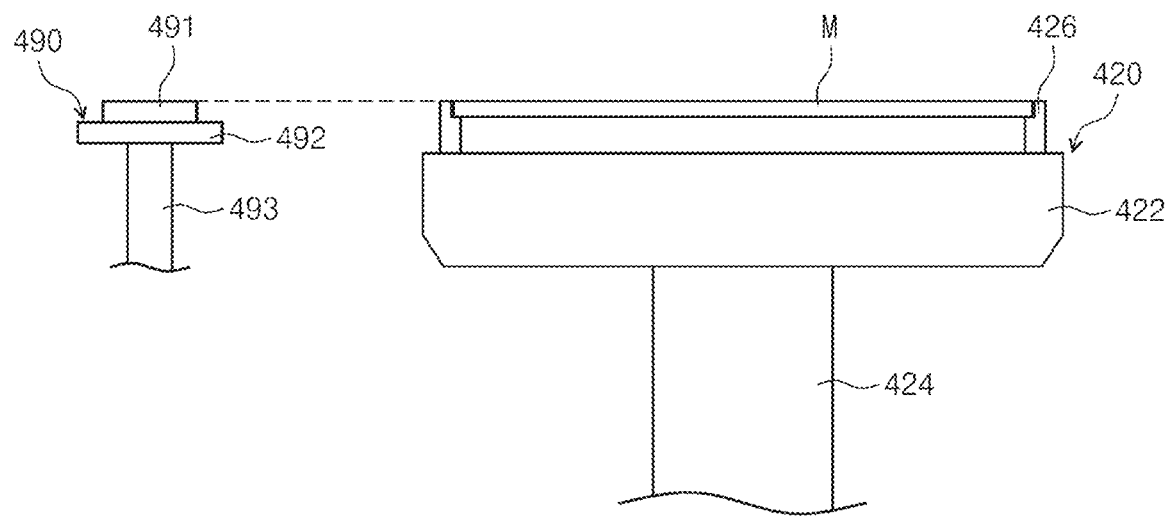
FIG. 8 illustrates an error checking unit and a support unit of the liquid treating chamber of FIG. 4.
Figure 9:
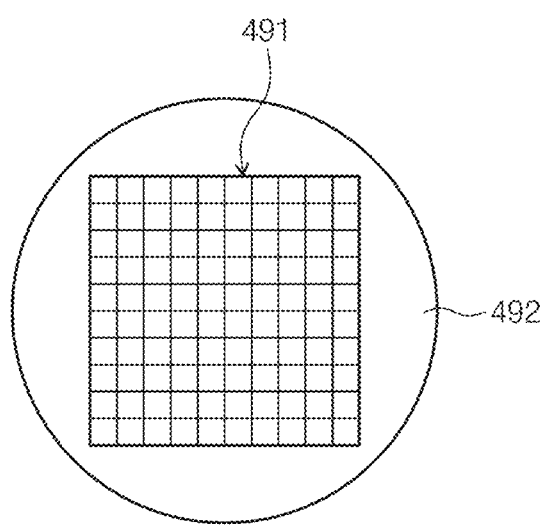
FIG. 9 is a top view of the error checking unit of FIG. 8.

FIG. 8 illustrates an error checking unit of the liquid treating chamber and a support unit of FIG. 4, and FIG. 9 is a top view of the error checking unit of FIG. 8.

Referring to FIG. 8 and FIG. 9, the error checking unit 490 can check whether an error occurs between the irradiation position of the laser L and a target position TP which is preset. For example, the error checking unit 490 may be provided in the inner space 412. Also, when the irradiation end portion 452 is in the above-described standby position, the error confirmation unit 490 may be installed under the irradiation end portion 452. The error checking unit 490 may include a coordinate system 491, a plate 492, and a support frame 493.

The coordinate system 491 may be referred to as a global coordinate system. The preset target position TP may be marked on the coordinate system 491. In addition, the coordinate system 491 may include a scale to check an error between the target position TP and the irradiation position to which the laser L is irradiated. The coordinate system 491 may be installed on the plate 492. The plate 492 may be supported by a support frame 493. A height of the coordinate system 491 determined by the plate 492 and the support frame 493 may be the same height as a substrate M supported by the support unit 420. For example, a height from a bottom surface of the housing (not shown) to a top surface of the coordinate system 491 may be the same as a height from the bottom surface of the housing (not shown) to a top surface of the substrate M supported by the support unit 420. This is to match a height of the irradiation end portion 452 when checking an error using the error checking unit 490, and the height of the irradiation end portion 452 when heating the substrate M. When an irradiation direction of the laser L irradiated by the laser irradiation unit 461 is slightly distorted with respect to a third direction Z, the irradiation position of the laser L may vary according to a height of the irradiation end portion 452, and thus the coordinate system 491 may be provided at the same height as the substrate M supported by the support unit 420.

Hereinafter, a substrate treating method according to an embodiment of the inventive concept will be described in detail. The substrate treating method described below may be performed by the liquid treating chamber 400 described above. Also, the controller 30 can control components of the liquid treating chamber 400 so that the liquid treating chamber 400 can perform the substrate treating method described below. For example, the controller 30 may generate a control signal for controlling at least one of a support unit 420, a lifting/lowering member 436, a liquid supply unit 440, and a heating unit 450 so that the components of the liquid treating chamber 400 may perform the substrate treating method described below.

Figure 10:
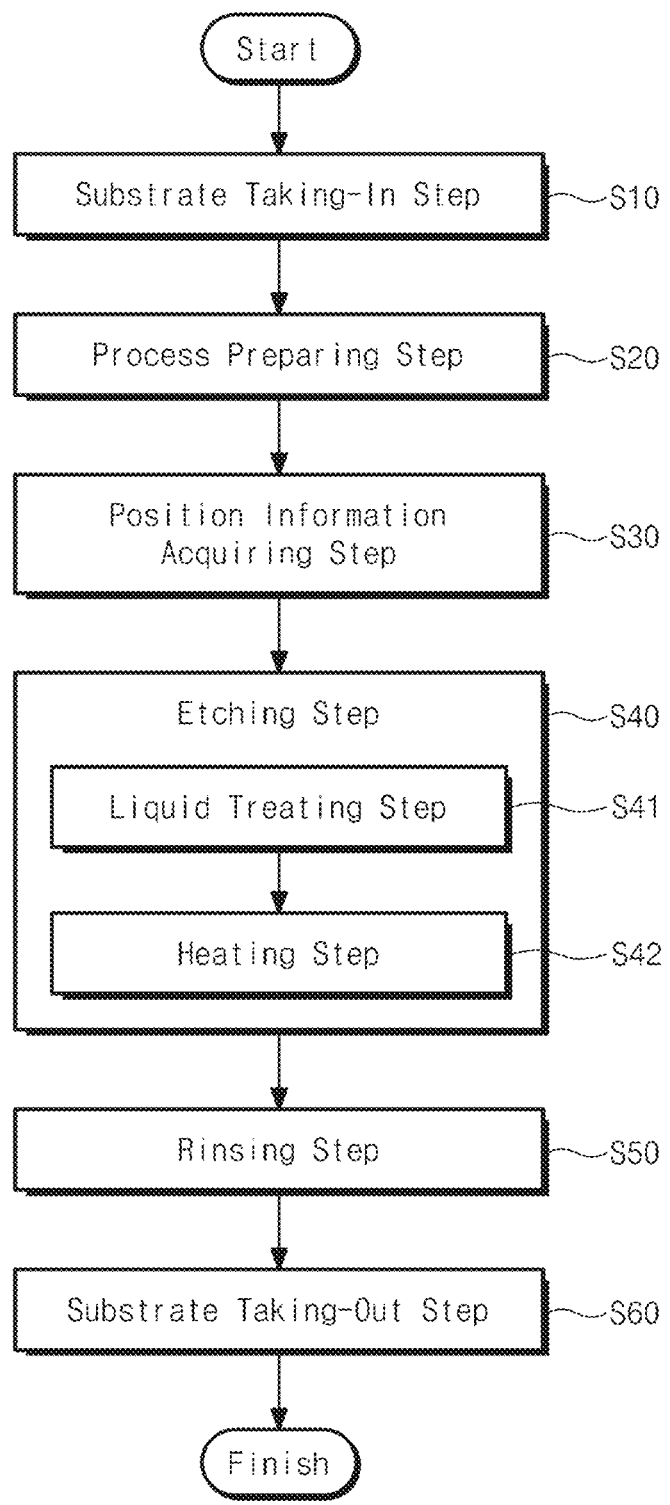
FIG. 10 is a flowchart illustrating a substrate treating method according to an embodiment of the inventive concept.

FIG. 10 is a flowchart illustrating a substrate treating method according to an embodiment of the inventive concept.

Referring to FIG. 10, the substrate treating method according to an embodiment of the inventive concept may include a substrate taking-in step S10, a process preparing step S20, a position information acquiring step S30, an etching step S40, a rinsing step S50, and a substrate taking-out step S60.

In the substrate taking-in step S10, a door may open a taking-in/out port formed at the housing (not shown). In addition, in the substrate taking-in step S10, the transfer robot 320 may seat a substrate M on a support unit 420. While the transfer robot 320 seats the substrate M on the support unit 420, a lifting/lowering member 436 may lower a position of a bowl 430.

Figure 11:
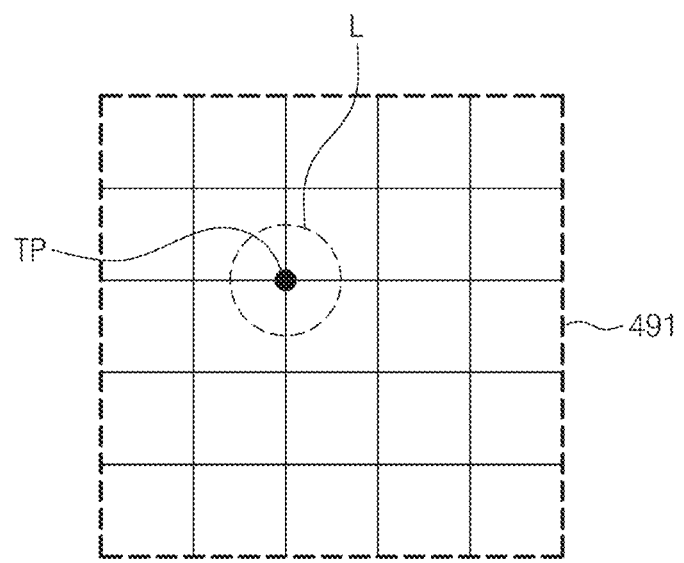
FIG. 11 illustrates a state in which the substrate treating apparatus checks an error between an irradiation position of a laser and a preset target position in a process preparing step of FIG. 10.

The process preparing step S20 may be performed after a taking-in of a substrate M is completed. In the process preparing step S20, it may be confirmed whether an error occurs at the irradiation position of a laser L irradiated to the substrate M. For example, in the process preparing step S20, a laser module 460 may irradiate a test laser L to a coordinate system 491 of the error checking unit 490. If the test laser L irradiated by the laser module 470 matches a preset target position TP indicated at the coordinate system 491 as illustrated in FIG. 11, it is determined that the laser irradiation unit 461 is not distorted, and the following position information acquiring step S30 may be performed. Also, in the process preparing step S20, not only may it be checked whether an error occurs at the irradiation position of the laser L, but also a configuration of the liquid treating chamber 400 may be returned to the initial state.

At the position information acquiring step S30, a position of the substrate M may be confirmed. At the position information acquiring step S30, a position information of patterns formed on the substrate M may be acquired. That is, at the position information acquiring step S30, an information on a chemical C, a position of the substrate M to which a rinsing liquid R is to be supplied, and a position of a pattern to which the laser L is to be irradiated may be obtained. The position information obtained at the position information acquiring step S30 may include coordinates related to a center of the substrate M and coordinates related to the position of the pattern.

Figure 12:
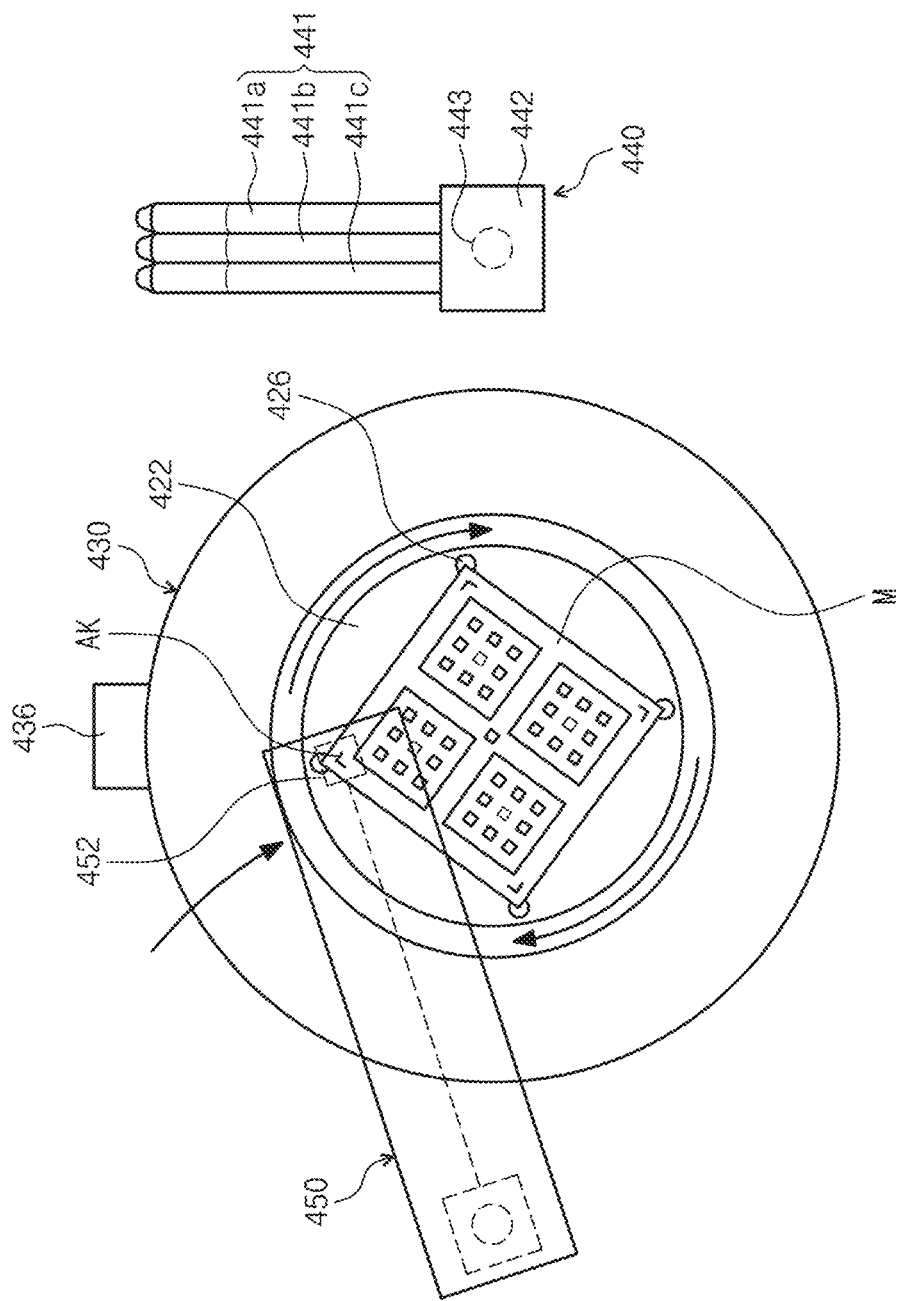
FIG. 12 illustrates a state of the substrate treating apparatus performing a position information acquiring step of FIG. 10.

The position information acquiring step S30 may be performed by moving the irradiation end portion 452 of the heating unit 450 between a standby position and a heating position, and by rotating the substrate M in a direction by the support unit 420. When the irradiation end portion 452 is moved and the substrate M is rotated in a direction, the irradiation end portion 452 may have the reference marks AK coincident with each other at a specific time point as illustrated in FIG. 12. In this case, the image module 470 may acquire an image with respect to the reference mark AK. The controller 30 may obtain a coordinate value with respect to the reference mark AK through the image acquired by the image module 470. In addition, the controller 30 may store left and right widths of the substrate M, a coordinate data with respect to a center point of the substrate M, the first pattern P1, the second pattern P2, and a position of an exposing pattern EP within the substrate M in advance. The controller 30 may obtain a position information with respect to the center point of the substrate M, the first pattern P1, and the second pattern P2 based on an obtained coordinate value with respect to the reference mark AK and the previously stored data.

In an etching step S40, an etching on a pattern formed on the substrate M may be performed. In the etching step S40, an etching with respect to the pattern formed on the substrate M can be carried out so that a critical dimension of the first pattern P1 and a critical dimension of the second pattern P2 coincide with each other. The etching step S40 may be a critical dimension correction process for correcting a critical dimension difference between the first pattern P1 and the second pattern P2 described above. The etching step S40 may include a liquid treating step S41 and a heating step S42.

Figure 13:
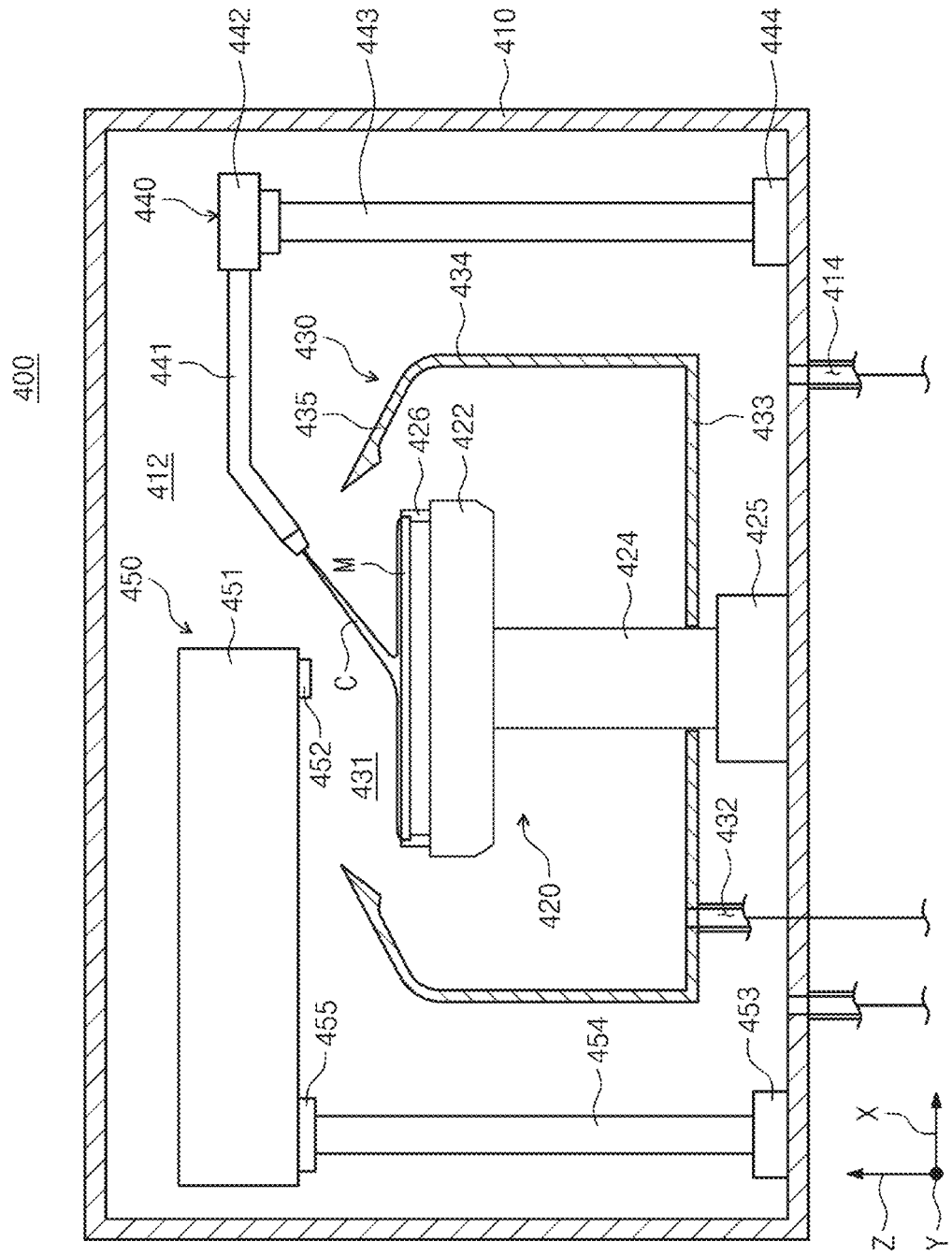
FIG. 13 illustrates a state of the substrate treating apparatus performing a liquid treating step of FIG. 10.

The liquid treating step S41 may be a step in which a liquid supply unit 440 supplies an etchant which is a chemical C to a substrate M as illustrated in FIG. 13. In the liquid treating step S41, a support unit 420 may not rotate the substrate M. In order to accurately irradiate the laser L to a specific pattern at a heating step S42 to be described later, a distortion of the position of the substrate M should be minimized, because when the substrate M is rotated, the position of the substrate M may be distorted. Also, an amount of the chemical C supplied at the liquid treating step S41 may be supplied enough to form a puddle of the chemical C supplied onto the substrate M. For example, the amount of the chemical C supplied at the liquid treating step S41 may cover an entire top surface of the substrate M, but may be supplied to a degree that the amount of the chemical C does not flow down or is not large even when if the chemical C flows down from the substrate M. If necessary, the etchant may be supplied to an entire top surface of the substrate M while a nozzle 441 changes its position.

Figure 14:
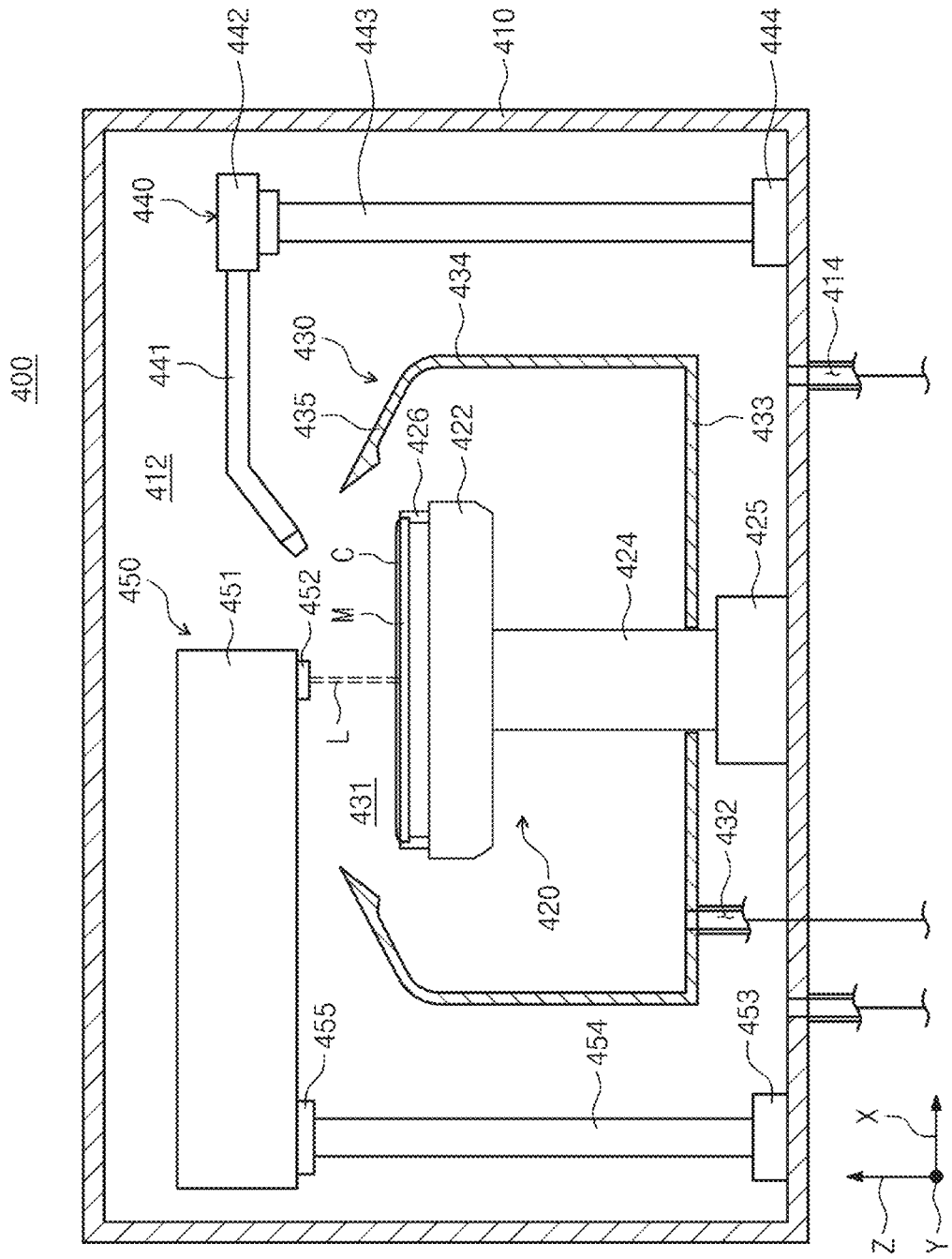
FIG. 14 illustrates a state of the substrate treating apparatus performing a heating step of FIG. 10.

In the heating step S42, a substrate M may be heated by irradiating a laser L to the substrate M. In the heating step S42, as illustrated in FIG. 14 the heating module 460 can heat a substrate M on which a liquid film is formed due to supplying the chemical C by irradiating the laser L to the substrate M.

In the heating step S42, the laser L may be irradiated to a specific area of the substrate M. A temperature of the specific area to which the laser L is irradiated may be increased. Accordingly, an etching degree by the chemical C of a region to which the laser L is irradiated may increase. In addition, in the heating step S42, the laser L may be irradiated to any one of the first pattern P1 or the second pattern P2. For example, the laser L may be emitted only to the second pattern P2 among the first pattern P1 and the second pattern P2. Accordingly, an etching ability of the chemical C with respect to the second pattern P2 is improved. Accordingly, a critical dimension of the first pattern P1 may be changed from a first width (e.g., 69 nm) to a target critical dimension (e.g., 70 nm). Also, a critical dimension of the second pattern P2 may be changed from a second width (e.g., 68.5 nm) to the target critical dimension (e.g., 70 nm). That is, it is possible to minimize a critical dimension deviation of a pattern formed on the substrate M by improving the etching ability with respect to some regions of the substrate M. In the rinsing step S50, process by-products generated in the etching step S40 may be removed from the substrate M.

Figure 15:
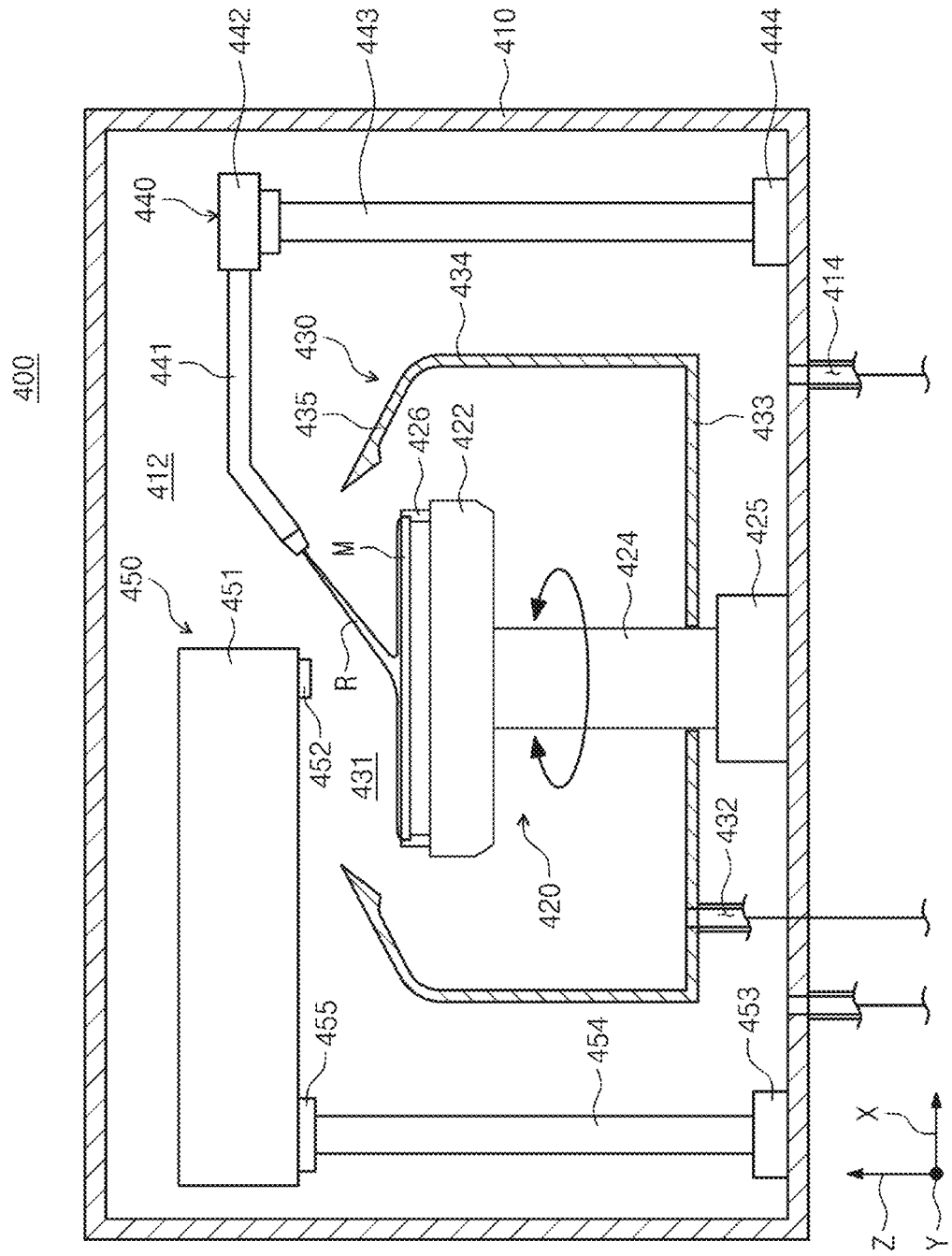
FIG. 15 illustrates a state of the substrate treating apparatus performing a rinsing step of FIG. 10.

In the rinsing step S50, as illustrated in FIG. 15 a rinsing liquid R may be supplied to a rotating substrate M to remove process by-products formed on the substrate M. In order to dry a rinsing liquid R remaining on the substrate M as necessary, the support unit 420 may rotate the substrate M at a high speed to remove the rinsing liquid R remaining on the substrate M.

In the substrate taking-out step S60, a substrate M which has been treated may be taken out from an inner space 412.

In the substrate taking-out step S60, a door may open a taking-in/out port formed at the housing (not shown). In addition, in the substrate taking-out step S60, a transfer robot 320 may unload the substrate M from the support unit 420 and take an unloaded substrate M out of the inner space 412.

Hereinafter, a method of correcting a distortion (referred to as an error correction method) will be described in detail regarding in a case of when the distortion occurs in the irradiation direction of the laser L irradiated by the laser irradiation unit 461.

Figure 16:
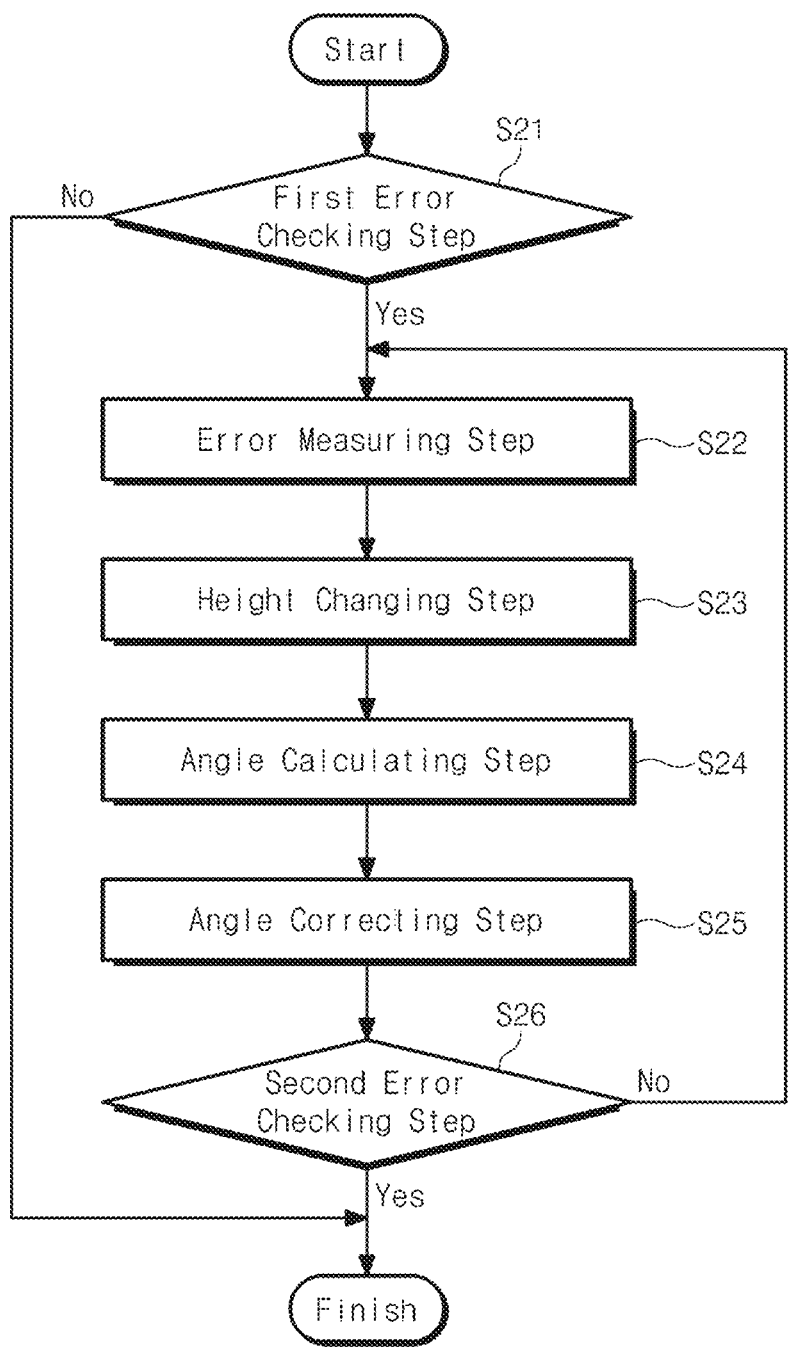
FIG. 16 is a flowchart illustrating an error correction method according to an embodiment of the inventive concept.

FIG. 16 is a flowchart illustrating an error correction method according to an embodiment of the inventive concept.

Referring to FIG. 16, the error correction method of the inventive concept may include a first error checking step S21, an error measuring step S22, a height changing step S23, an angle calculating step S24, an angle correcting step S25, and a second error checking step S26. In addition, the error correction method of the inventive concept can be performed while a process treating step such as an etching step S40 and a rinsing step S50 with respect to the substrate M is not being performed. For example, the error correction method of the inventive concept may be performed in the above-described process preparing step S20.

In the first error checking step S21, a laser L may be irradiated to a coordinate system 491 of the error checking unit 490. A height of an irradiation end portion 452 when the laser L is irradiated at the first error checking step S21 may be the same as a height when the heating step S42 with respect to the substrate M is performed (this may be referred to as a first height).

Figure 17:
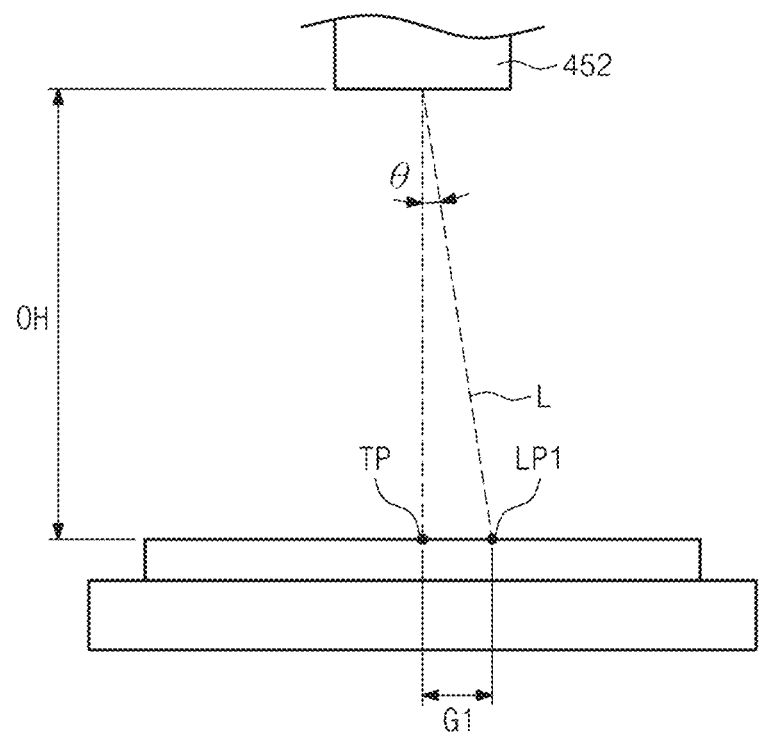
FIG. 17 illustrates a state of the substrate treating apparatus for performing an error checking step and an error measuring step of FIG. 16.
Figure 18:
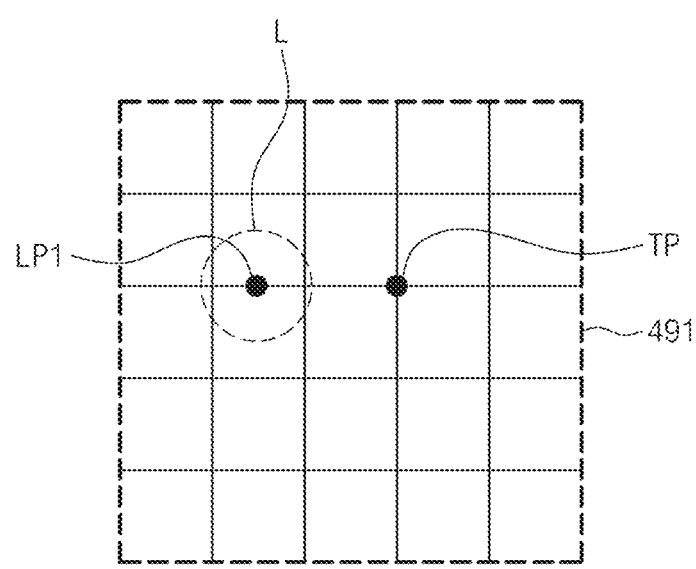
FIG. 18 is a view of a coordinate system of FIG. 17 viewed from the image module of the heating unit.

When no error occurs between a target position TP displayed on the coordinate system 491 and the irradiation position of the laser L, an error correction process may be immediately terminated. However, as illustrated in FIG. 17 and FIG. 18, when an error between a target position TP and a first irradiation position LP1 of the laser L (The first irradiation position may be a central position of the laser L irradiated to the coordinate system 491 in a state which the irradiation end portion 452 is in a standby position and a height thereof is the first height described above) may be measured, the error measuring step S22 may be performed as follows.

In the error measuring step S22, when the error is confirmed at the first error checking step S21, a first gap G1 between the first irradiation position LP1 and the target position TP may be measured. A controller 30 may store the first gap G1 which has been measured.

Figure 19:
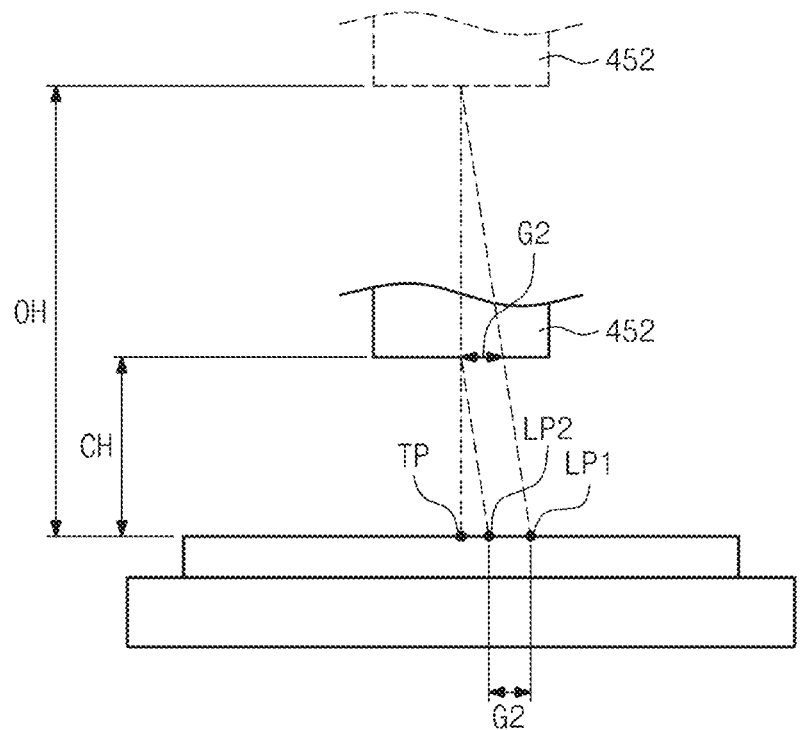
FIG. 19 illustrates a state of the substrate treating apparatus for performing a height changing step and an angle calculating step of FIG. 16.
Figure 20:
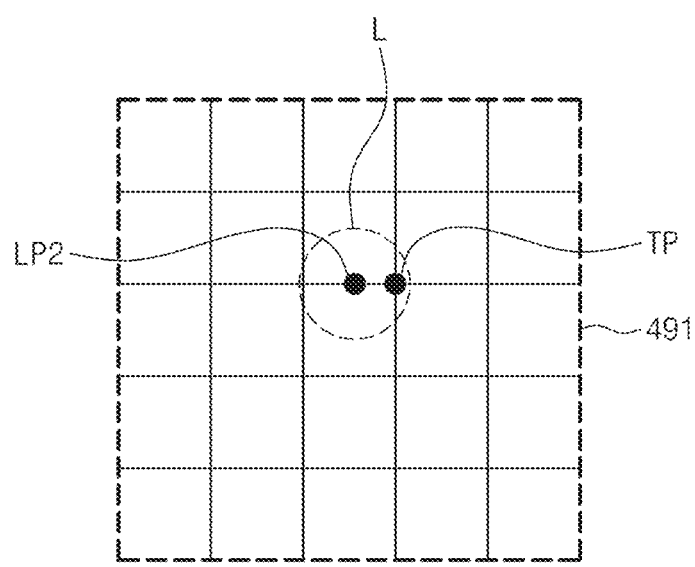
FIG. 20 is a view of the coordinate system of FIG. 19 viewed from the image module of the heating unit.

In the height changing step S23, a height of the irradiation end portion 452 may be changed. In the height changing step S23, a second height CH, which is a height when the irradiation position of the laser L is closest to the target position TP, may be measured while changing the height of the irradiation end portion 452 in an up/down direction as illustrated in FIG. 19 and FIG. 20. In addition, the irradiation position of the laser L1 closest to the target position TP may be referred to as a second irradiation position LP2. In addition, a space between the first irradiation position LP1 and the second irradiation position LP2 may be referred to as a second gap G2. The controller 30 may store the second height CH and the second gap G2 which have been measured.

In the angle calculating step S24, a difference between the first height OH and the second height CH may be derived. Furthermore, the tilting angle Θ of the laser L may be derived based on a height difference value OH−CH between the first gap G1, and the first height OH and the second height CH. In addition, when the irradiation end portion 452 moves between the first height OH and the second height CH, the irradiation position of the laser L moves between the second irradiation position LP2 and the first irradiation position LP1. In some cases, the second irradiation position LP2 may not exactly coincide with the target position TP. However, since the second irradiation position LP2 is an irradiation position closest to the target position TP, a difference between the above-described first gap G1 and the second gap G2 may be negligibly small. Accordingly, even if the tilting angle Θ of the laser L is derived based on the height difference value OH−CH between the first gap G1, and the first height OH and the second height CH, an accuracy of the tilting angle Θ which is derived may be very high.

Figure 21:
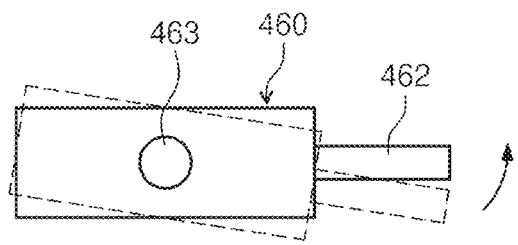
FIG. 21 illustrates a state in which a tilting member tilts the laser irradiation unit.

In the angle correcting step S25, an irradiation direction of the laser L irradiated by the laser irradiation unit 461 may be tilted based on the tilting angle Θ derived at the angle calculating step S24. In the angle correcting step S25, as shown in FIG. 21, a tilting member 463 may rotate the laser irradiation unit 461 to tilt the irradiation direction of the laser L. In the angle correcting step S25, the irradiation direction of the laser L may be tilted so that the tilting angle Θ becomes 0 (i.e., the irradiation direction of the laser L is parallel to the third direction Z).

In the second error checking step S26, the error between the irradiation position of the laser L and the target position TP can be checked in the same way as in the first error checking step S21. When the error is confirmed, the error measuring step S22, the height changing step S23, the angle calculating step S24, and the angle correcting step S25 which are mentioned above may be sequentially performed again, and when the error is not confirmed, the error correction method may be terminated. In addition, an absence of the error should be interpreted as including not only a case where the irradiation position of the laser L and the target position TP are completely coincident, but also a case within a threshold error range even if there is a slight error.

Although the above-described example has been described as an example in which the tilting member 463 tilts the laser irradiation unit 461, the inventive concept is not limited thereto. For example, the tilting member 463 may be configured to tilt a first reflective member 481 instead of the laser irradiation unit 461. In addition, a plurality of tilting members 463 may be provided, and one of the tilting members 463 may tilt the laser irradiation unit 461, and the other of the tilting members 463 may tilt the first reflective member 481.

In the above-described example, it has been described that the tilting member 463 includes a motor, but the inventive concept is not limited thereto. For example, the tilting member 463 may not include a motor. For example, the tilting member 463 may include a configuration such as a screw or a bolt so that an operator may manually correct the irradiation direction of the laser L.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a support unit configured to support a substrate having a first pattern and a second pattern which is formed at a different position from the first pattern;
a liquid supply unit for supplying a treating liquid to the substrate supported on the support unit;
a heating unit configured to irradiate a laser to the substrate to which the treating liquid is supplied and to heat any one among the first pattern or the second pattern; and
an error checking unit configured to check an error between an irradiation position of the laser and a target position which is preset.

2. The substrate treating apparatus of claim 1, wherein the error checking unit comprises:
a coordinate system which is provided at the same height as the substrate supported on the support unit; and
a support frame for supporting the coordinate system.

3. The substrate treating apparatus of claim 2, wherein the heating unit comprises:
a laser irradiation unit configured to irradiate the laser; and
a tilting member configured to tilt an irradiation direction of a laser irradiated by the laser irradiation unit.

4. The substrate treating apparatus of claim 3, wherein the heating unit further comprises:
a body which is installed at the laser irradiation unit and the tilting member, the body including an irradiation end portion for irradiating the laser; and
a driver for rotating the body and/or moving the body in an up/down direction.

5. The substrate treating apparatus of claim 4, wherein the heating unit further comprises an image module configured to monitor the laser irradiated by the laser irradiation unit.

6. The substrate treating apparatus of claim 5, further comprising a controller for controlling the heating unit, and
wherein the controller controls the laser irradiation unit to irradiate the laser from the irradiation end portion at a first height, which is a height of the irradiation end portion when irradiating the laser to the substrate, to the coordination system, and checks whether an error occurs between the irradiation position of the laser and the target position through the image module.

7. The substrate treating apparatus of claim 6, wherein the controller measures a second height which is a height of the irradiation end portion if the irradiation position is at a position closest to the target position, while moving the body in the up/down direction.

8. The substrate treating apparatus of claim 7, wherein the controller derives a tilting angle of the laser irradiated by the laser irradiation unit through a difference between the first height and the second height, and a gap between an irradiation position and a target position at the first height.

9. The substrate treating apparatus of claim 8, wherein the controller controls the tilting member to tilt in the irradiation direction of the laser irradiated by the laser irradiation unit based on the tilting angle.

10. A substrate treating apparatus comprising:
a housing having an inner space;
a treating container provided at the inner space and proving a treating space for treating a substrate, the substrate being a mask having a first pattern and a second pattern which is formed at a different position from the first pattern;
a support unit configured to support the substrate at the treating space;
a liquid supply unit configured to supply a treating liquid to a substrate supported by the support unit;
a heating unit configured to heat any one of the first pattern or the second pattern by irradiating a laser to the substrate supplied with the treating liquid; and
an error checking unit configured to check a gap between an irradiation position of the laser and a target position which is preset, and
wherein the error checking unit comprises:
a coordinate system having a top surface provided at the same height as a height of a top surface of the substrate supported by the support unit; and
a support frame supporting the coordinate system.

11. The substrate treating apparatus of claim 10, wherein the heating unit comprises:
a laser irradiation module configured to irradiate the laser;
an image module configured to monitor a laser irradiated by the laser irradiation module and/or the substrate; and
an optical module, and
wherein the laser irradiation module comprises:
a laser irradiation unit; and
a beam expander for controlling a characteristic of a laser irradiated by the laser irradiation unit, and
wherein the image module comprises:
an image acquisition member configured to acquire an image; and
an illumination member configured to provide a light so the image acquiring member may acquire the image, and
wherein the optical module comprises:
a first reflective member configured to change an irradiation direction of the laser irradiated by the laser irradiation unit; and
a second reflective member configured to change an imaging direction of the image acquisition member and an irradiation direction of the light, and
wherein the irradiation direction of the laser, the imaging direction of the image acquisition member, and the irradiation direction the light have the same axle when seen from above.

12. The substrate treating apparatus of claim 10, wherein the heating unit comprises:
a tilting member configured to tilt the irradiation direction of the laser irradiated by the laser irradiation unit;
a body at which the laser irradiation unit and the tilting member is installed, the body including an irradiation end portion configured to irradiate the laser; and
a driver for rotating the body and/or moving the body in an up/down direction, and
wherein the substrate treating apparatus further comprises a controller for controlling the heating unit, and
the controller controls the laser irradiation unit so the irradiation end portion irradiates the laser to the coordinate system at a first height which is a height of the irradiation end portion if the laser is irradiated to the substrate,
checks whether an error has occurred between the irradiation position of the laser and the target position through the image module,
measures a second height which is a height of the irradiation end portion if the irradiation position is closest to the target position, while moving the body in the up/down direction, if the error occurs, and derives a tilting angle of the laser irradiated by the laser irradiation unit through a difference between the first height and the second height, and a difference between the irradiation position and the target position at the first height.

\* \* \* \* \*